(12) United States Patent
Kubota et al.

(10) Patent No.: US 6,190,495 B1
(45) Date of Patent: Feb. 20, 2001

(54) MAGNETRON PLASMA PROCESSING APPARATUS

(75) Inventors: Kazuhiro Kubota, Nakakoma-gun; Shigeki Tozawa, Nirasaki; Jun Hirose, Nakakoma-gun; Akira Koshiishi, Kofu; Tomomi Kondo, Fukuyama, all of (JP)

(73) Assignee: Tokyo Electron Limited, Tokyo (JP)

( * ) Notice: Under 35 U.S.C. 154(b), the term of this patent shall be extended for 0 days.

(21) Appl. No.: 09/361,992

(22) Filed: Jul. 28, 1999

(30) Foreign Application Priority Data

Jul. 29, 1998 (JP) .................................................. 10-228645
Jan. 18, 1999 (JP) .................................................. 11-008856
May 6, 1999 (JP) .................................................. 11-125636

(51) Int. Cl.$^7$ .............................. B23K 10/00; C23F 1/02; C23C 16/00; H01L 21/00

(52) U.S. Cl. .................................. 156/345; 118/723 MA; 204/298.16

(58) Field of Search .................... 156/345; 118/723 MA; 204/298.16, 298.2

(56) References Cited

U.S. PATENT DOCUMENTS

| | | | |
|---|---|---|---|
| 5,444,207 | 8/1995 | Sekine et al. | 219/121.43 |
| 5,519,373 | 5/1996 | Miyata | 335/306 |
| 5,659,276 | 8/1997 | Miyata | 335/209 |

*Primary Examiner*—Gregory Mills
*Assistant Examiner*—Alva C Powell
(74) *Attorney, Agent, or Firm*—Oblon, Spivak, McClelland, Maier & Neustadt, P.C.

(57) ABSTRACT

The magnetron plasma processing apparatus includes a vacuum chamber in which a semiconductor wafer is accommodated. In the chamber, a pair of electrodes are provided to face each other, and the wafer is placed on one electrode. Between a pair of the electrodes, a vertical electric field is formed, and a horizontal magnetic field is formed by the dipole ring magnet to cross perpendicularly to the electric field. The magnetic field has a gradient of the magnetic field intensity such that the intensity is high on the upstream side and is low on the downstream side in the electron-drift direction. Further, the magnetic field is formed such that the intensity is made uniform over a large area including the end portion of the wafer on the upstream side in the electron-drift direction and a region right outside it.

23 Claims, 8 Drawing Sheets

MAGNETRON PLASMA PROCESSING APPARATUS

BACKGROUND OF THE INVENTION

The present invention relates to a magnetron plasma processing apparatus for processing a substrate, such as a semiconductor wafer, with magnetron plasma.

Recently, a magnetron plasma etching apparatus has come into practical use, because it can produce plasma of a high density at a relatively low atmosphere and performs etching of a fine process. In this apparatus, a permanent magnet is arranged above the chamber, and a magnetic field which leaks from the permanent magnet is applied horizontally to a semiconductor wafer. Further, an RF (Radio Frequency) electric field is applied to perpendicularly cross the magnetic field. Thus, the magnetic field and electric field are utilized in co-operation so as to cause drift motion of electrons, by which etching is carried out at extremely high efficiency.

In such magnetron plasma, it is a magnetic field perpendicular to the electric field, i.e., horizontal and parallel to the semiconductor wafer, that contributes to the drift motion of electrons. However, in the above-described apparatus, a uniform and horizontal magnetic field is not always formed, and therefore a sufficient uniformity of plasma cannot be obtained. As a result, problems including the non-uniformity of the etching rate and the charge-up damage occur.

Figure 17:
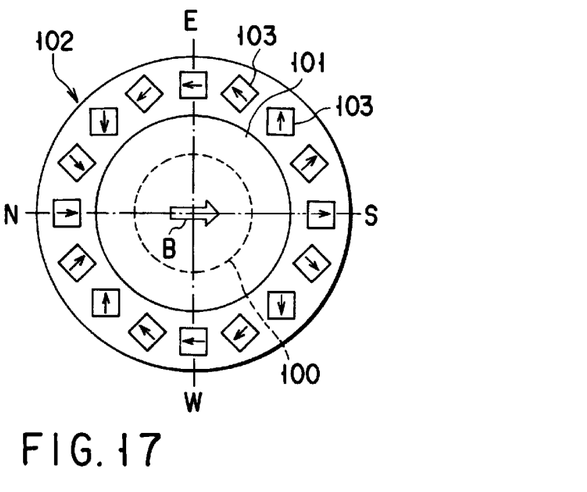
FIG. 17 is a schematic view showing a conventional dipole ring magnet.

In order to avoid such problems, there is a demand of forming a uniform magnetic field parallel to the semiconductor wafer within the process space of the chamber. A dipole ring magnet is known as a magnet capable of generating such a magnetic field. As shown in FIG. 17, a dipole ring magnet 102 has a structure in which a plurality of anisotropic pole-shaped magnet segments 103 are disposed to be a ring-like format around a chamber 101. As the directions of magnetization of these magnet segments 103 are shifted gradually, a uniform horizontal magnetic field B is generated as a whole. FIG. 17 is a view (plan view) of the apparatus taken from above, and the proximal end side of the magnetic field direction is represented by N, the distal end side by S, and the positions arranged at angle of 90° from these sides by E and W, respectively. Further, in FIG. 17, a semiconductor wafer is represented by reference numeral 100.

The horizontal magnetic field generated by such a dipole ring magnet is a field directing in only one direction from N to S in FIG. 17. Therefore, only with the magnetic field itself, electrons travel in a drift motion in one direction, causing a non-uniformity of the plasma density. More specifically, electrons travel in the direction of the outer product of the electric field and magnetic field, that is, they move from E to W in a drift motion, in the case where the electric field is generated to direct from above to below. As a result, a non-uniformity in the plasma density is caused such that it is low at E side and high at W side.

In order to avoid this, the dipole ring magnet is rotated along its angular direction so as to vary the direction of the drift motion of the electrons. However, with merely such an operation, the plasma density cannot be unified in a wide range.

Figure 18:
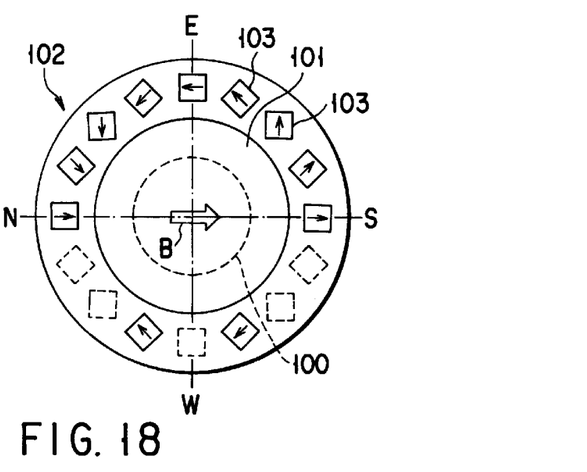
FIG. 18 is a schematic view showing a conventional dipole ring magnet.
Figure 19:
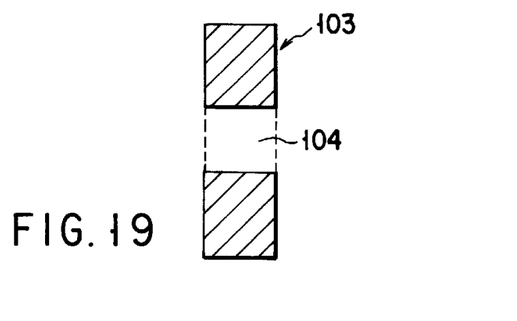
FIG. 19 is a cross-sectional view showing anisotropic columnar magnet segment used in the conventional dipole ring magnet.

Under these circumstances, a technique has been proposed, in which a gradient of the magnetic field is created in the direction from E towards W in FIG. 17, and the problem of the non-uniformity of plasma, caused by the drift motion of electrons, is solved (Jpn. Pat. KOKAI Publication No. 9-27278). In this technique, as shown in FIG. 18, the number of magnet segments on the W side is reduced, and thus a gradient of the magnetic field intensity is created in the direction from E towards W.

When the size of the semiconductor wafer is increased to 300 mm in diameter, the electron density on the W side becomes excessively low with the above-described design of the magnet, and therefore the plasma density of that section becomes low, thereby causing an non-uniformity of the plasma. However, if the electron density on the W side is increased to a sufficient level so as to avoid the above problem, the magnetic field at the E side must be further intensified. In this case, the uniformity of plasma is disturbed in the vicinity of the E side of the semiconductor wafer. Consequently, when an insulating film, such as an oxide film, is etched, a charge-up damage or the like may be caused.

Further, recently, there has been a demand of further downsizing the devices, and accordingly, there is a demand of a plasma etching process which is carried out at a lower pressure than usual. In order to perform an efficient plasma etching process at a low pressure, it is necessary to further increase the plasma density. In this case, although the magnetic field intensity is generally increased, but, as described before, a problem of charge-up damage may occur when an insulating film, such as oxide film, is etched. In order to avoid the charge-up damage, the intensity of the electric field should be limited up to about 200 gausses at the position where the wafer is present. Thus, when the gradient of the magnetic field is created with the above-described technique, the uniformity of the plasma can be improved; however at the same time, in order to avoid the charge-up damage, the plasma density cannot be fully increased, and therefore the etching rate becomes insufficient.

On the other hand, Jpn. Pat. Appln. KOKAI Publication No. 7-197255 discloses another technique for solving the problem of the non-uniformity of plasma, by adjusting the magnetic field intensity in the dipole ring magnet shown in FIG. 17. In this publication, a slit 104 is made at the center in the longitudinal direction of each of a plurality of anisotropic columnar magnet segments 103 and the size of each gap is set to correspond to the position of the respective magnet segment in the dipole ring magnet. In this case, each magnet segment consists of a pair of upper and lower portions.

Jpn. Pat. Appln. KOKAI Publication No. 9-27277 discloses a technique of solving the problem of non-uniformity of the plasma density, which is caused by the drift of electrons described above. More specifically, in this reference, a slit is also made at the center in the longitudinal direction of each of a plurality of anisotropic columnar magnet segments and the size of each gap is set to correspond to the position of the respective magnet segment, as in Jpn. Pat. Appln. KOKAI Publication No. 7-197255. The size of the gap is set such that a gradient of the magnetic field intensity is created in the electron-drift direction, that is, the direction taken from E towards W in FIG. 17, and thus the problem of the non-uniformity of plasma, caused by the drift motion of electrons, can be solved.

However, with the techniques disclosed in Jpn. Pat. Appln. KOKAI Publications Nos. 7-197255 and 9-27277, the z-component (component perpendicular to the surface of the wafer) of the magnetic field is disturbed in the vicinity of the magnet segment in a plasma forming space, due to the gap made at the center of the anisotropic columnar magnetic segment. As a result, it is considered that the electron-drift direction may be reversed in the disturbed section, causing an adverse effect to the result of the process.

BRIEF SUMMARY OF THE INVENTION

The present invention has been proposed in consideration of the above-descried circumstances, and an object of the invention is to provide a magnetron plasma processing apparatus capable of creating plasma uniformly in a process space even when a target substrate to be processed is large in size.

Another object of the invention is to provide a magnetron plasma processing apparatus capable of performing a uniform plasma process, which is less influenced by the electron drift, by creating a desired gradient of the magnetic field intensity within a process space for a target substrate, and capable of increasing the plasma density within the process space.

Still another object of the present invention is to provide a magnetron plasma processing apparatus capable of correcting the magnetic field without causing the disturbance of the z-component of the magnetic field, and capable of performing an excellent plasma process.

According to the present invention, there is provided a magnetron plasma processing apparatus comprising, as a common structure to several aspects:

a chamber configured to accommodate a target substrate;

a pair of electrodes arranged in the chamber to face each other, the target substrate being mounted on one of the electrodes to be position between the electrodes;

an electric field generator configured to generate an electric field between the electrodes to have an electric field direction in a first direction connecting the electrodes to each other;

an exhaust mechanism configured to exhaust and set the chamber to a vacuum;

a process gas supply mechanism configured to supply a process gas into the chamber; and a magnetic field generator configured to generate a magnetic field between the electrodes to have a magnetic field direction in a second direction perpendicular to the first direction, electrons being caused to drift in a drift direction perpendicular to the first and second directions, in cooperation with the electric field and the magnetic field.

According to the first aspect of the present invention, there is provided a magnetron plasma processing apparatus comprising the common structure wherein the magnetic field is designed, on a plane perpendicular to the first direction between the electrodes, to have a gradient of a magnetic field intensity such that the magnetic field intensity is higher on an upstream side and is lower on a downstream side in the drift direction, and to have a uniform magnetic field intensity over a large area along an upstream end of the target substrate in the drift direction and a region outside the upstream end.

According to the second aspect of the present invention, there is provided a magnetron plasma processing apparatus comprising the common structure wherein the magnetic field is designed, on a plane perpendicular to the first direction between the electrodes, to have a gradient of a magnetic field intensity such that the magnetic field intensity is higher on an upstream side and is lower on a downstream side in the drift direction, and to have a plurality of peaks of a magnetic field intensity in an upstream end area in the chamber in the drift direction.

According to the third aspect of the present invention, there is provided a magnetron plasma processing apparatus comprising the common structure wherein the magnetic field is designed, on a plane perpendicular to the first direction between the electrodes, to have a gradient of a magnetic field intensity such that the magnetic field intensity is higher on an upstream side and is lower on a downstream side in the drift direction, and such that a gradient of a magnetic field intensity at a position outside the upstream end of the target substrate in the drift direction is steeper than a gradient of a magnetic field on a surface of the target substrate.

According to the fourth aspect of the present invention, there is provided a magnetron plasma processing apparatus comprising the common structure wherein the magnetic field generator comprises a dipole ring magnet formed such that a plurality of anisotropic magnet segments are arranged in a ring-like format around the chamber to form the magnetic field, and wherein the anisotropic magnet segments are provide with cavities, respectively, formed therein and extending in the first direction, and the cavities have sizes set in accordance with positions of the segments to cause the magnetic field to have a predetermined profile.

According to the present invention, there is further provided a magnetron plasma processing method, using an apparatus comprising the common structure, the method comprising, as a common process to several aspects, the steps of:

placing the target substrate in the chamber;

turning the process gas into plasma in the chamber by generating the electric field and the magnetic field, while supplying the process gas; and subjecting the target substrate to a treatment, using the plasma.

According to the fifth aspect of the present invention, there is provided a magnetron plasma processing method comprising the common process wherein the magnetic field is designed, on a plane perpendicular to the first direction between the electrodes, to have a gradient of a magnetic field intensity such that the magnetic field intensity is higher on an upstream side and is lower on a downstream side in the drift direction, and to have a uniform magnetic field intensity over a large area along an upstream end of the target substrate in the drift direction and a region outside the upstream end.

According to the sixth aspect of the present invention, there is provided a magnetron plasma processing method comprising the common process wherein the magnetic field is designed, on a plane perpendicular to the first direction between the electrodes, to have a gradient of a magnetic field intensity such that the magnetic field intensity is higher on an upstream side and is lower on a downstream side in the drift direction, and to have a plurality of peaks of a magnetic field intensity in an upstream end area in the chamber in the drift direction.

According to the first and fifth aspects of the present invention, a uniform and high magnetic field intensity can be achieved in a large area including an end portion of the target substrate on the highest magnetic field intensity side, and its outer region. Therefore, a large amount of drift electrons are supplied and drift from the large area of a high magnetic field intensity, and are dispersed to an even wider area. Consequently, even with a large-size target substrate, the density of drifting electrons on the downstream end in the electron-drift direction, where the magnetic field intensity is lowest, can be maintained to a sufficient level. Further, since the large area of the substrate has a high magnetic field intensity, it is not necessary to increase the magnetic field intensity for the purpose of avoiding an decrease in the density of drifting electrons. Consequently, there is a less possibility of a charge-up damage occurring in the upstream end of the substrate in the electron-drift direction.

According to the second and sixth aspects of the present invention, as a result of having a plurality of peaks of a magnetic field intensity, a uniform and high magnetic field intensity can be achieved in a large area including the upstream end of the substrate in the electron-drift direction. Therefore, a large amount of drift electrons are supplied and drift from the large area of a high magnetic field intensity, and are dispersed to an even wider area. Consequently, even with a large-size target substrate, the density of drifting electrons on the downstream end in the electron-drift direction, where the magnetic field intensity is lowest, can be maintained to a sufficient level. Further, the drifting electrons can be sufficiently supplied without increasing the magnetic field intensity in the upstream end of the substrate in the electron-drift direction. Consequently, there is a less possibility of a charge-up damage occurring in the upstream end of the substrate in the electron-drift direction.

According to the third aspect of the present invention, the magnetic field intensity can be further increased outside the upstream end of the substrate in the electron-drift direction. Consequently, the amount of plasma generated outside the upstream end of the substrate in the electron-drift direction is increased, and electrons are supplied therefrom to the downstream by electron drift. Therefore, the entire plasma density can be increased. Further, within the surface of the target substrate, a gradient of the magnetic field intensity can be decreased, and therefore the magnetic field intensity within the surface of the substrate can be decreased, thus suppressing the charge-up damage.

According to the fourth aspect, the magnetic field can be corrected without causing the disturbance of the z component of the magnetic field, which may occur in the case of the conventional anisotropic columnar magnet segments each having a slit at the center to separate the upper and lower portions from each other. Therefore, a desired magnetic field can be obtained without causing the disturbance of the z component of the magnetic field, and an excellent plasma etching process can be obtained. Further, the magnetic field is adjusted by varying the size of the cavity of each magnet segment, and therefore it is not necessary to replace the casing with another or change the method of mounting magnet to the casing, which are necessary in the case of the conventional magnet segment having the slit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION (First Embodiment)

Figure 1:
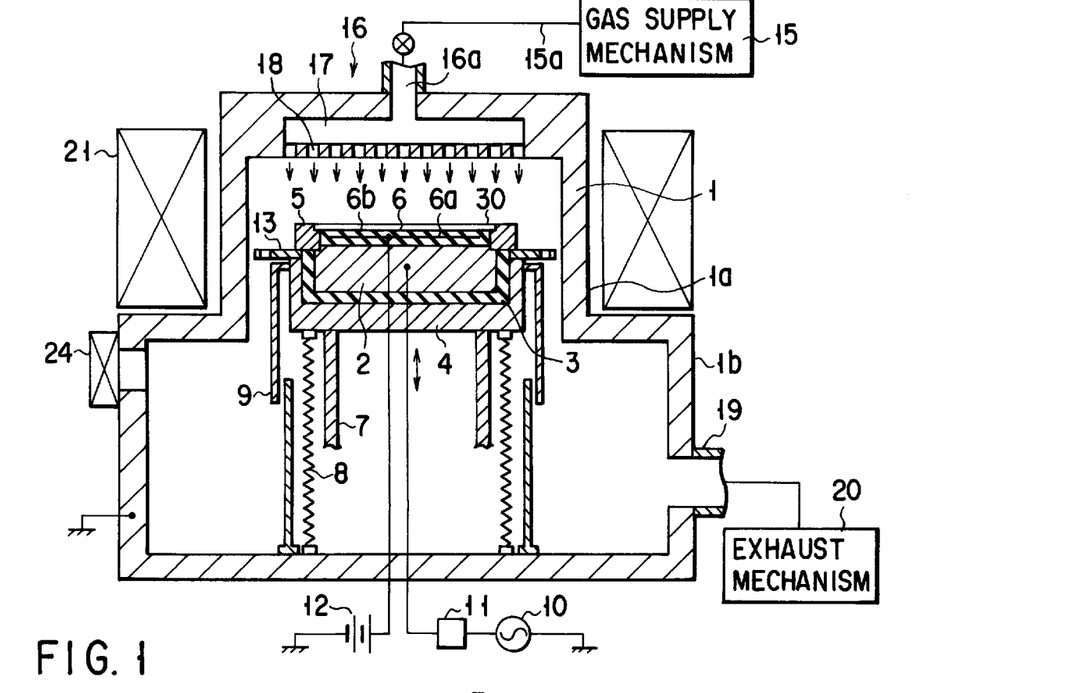
FIG. 1 is a cross-sectional view of a magnetron plasma etching apparatus according to the first embodiment of the present invention.

FIG. 1 is a cross-sectional view showing a magnetron plasma etching apparatus according to the first embodiment of the present invention. This etching apparatus has an airtight chamber 1 formed of aluminum walls and having a stepped cylindrical shape consisting of an upper portion 1a of a small diameter and a lower portion 1b of a large diameter. A work table 2 is arranged in the chamber 1 for horizontally supporting a semiconductor wafer 30, which is a target substrate to be processed. The work table 2 is made of, for example, aluminum, and is supported by a conductive support base 4 via an insulating plate 3. A focus ring 5 made of a conductive material, such as monocrystal silicon, is arranged on the work table 2 to surround the wafer. The work table 2 and the support base 4 are vertically moved by means of a ball screw mechanism containing a ball screw 7. The drive portion or lower portion of the support base 4 is covered by bellows 8 made of stainless steel (SUS). The chamber 1 is grounded. The bellows 8 is surrounded by a bellows cover 9.

An RF power supply 10 is connected to the work table 2 via a matching box 11. An RF power of, for example, 13.56 MHz is applied to the work table 2 from the RF power supply 10. On the other hand, above the work table 2, a shower head 16, which will be described later, is arranged to be in parallel with and face the table 2 and is grounded. With the above-described arrangement, the table 2 and the shower head 16 serve as a pair of electrodes.

An electrostatic chuck 6 for electrostatically attracting and holding a semiconductor wafer 30 is arranged on the surface of the work table 2. The electrostatic chuck 6 has a structure in which an electrode 6a is interposed between insulators 6b, and a DC power supply 12 is connected to the electrode 6a. When a voltage is applied from the power supply 12 to the electrode 6a, the semiconductor wafer 30 is attracted and held due to coulomb's force.

Inside the work table 2, a coolant flow path is provided although it is not shown in the drawings. As an appropriate coolant is circulated in the path, the semiconductor wafer 30 can be maintained at a predetermined temperature. Further, a baffle plate 13 is provided around the focus ring 5. The baffle plate 13 is electrically connected to the chamber 1 via the support base 4 and the bellows 8.

In the ceiling of the chamber 1, the shower head 16 is arranged to face the work table 2. The shower head 16 includes a number of gas spouting holes 18 on the bottom surface, and a gas inlet 16a at the top. A space 17 is formed in the shower head 16. The gas inlet 16a is connected through a gas supply pipe 15a to a process gas supply mechanism 15 for supplying a process gas including a reactive gas for etching, and a diluting gas. As the reactive gas, a halogen gas, which is generally used in this technical field, can be used, and as the diluting gas, Ar gas, He gas and the like, which are usually used in this technical field, can be used.

The process gas flows from the process gas supply mechanism 15 to the gas supply pipe 15a, and further to the space 17 in the shower head 16 via the gas inlet 16a. Then, the process gas is spouted from the gas spouting holes 18, to be used for etching the film formed on the semiconductor substrate 30.

At the side wall of the lower portion 1b of the process chamber 1, there is an exhaust port 19 which is connected to an exhaust mechanism 20. When a vacuum pump provided in the exhaust mechanism 20 is operated, the interior of the chamber 1 can be depressurized to a predetermined degree of vacuum. Meanwhile, at the upper side of the side wall of the lower portion 1b of the chamber 1, a gate valve 24 is arranged to open/close a transfer port for the wafer 30.

On the other hand, around the upper portion 1a of the chamber 1, a dipole ring magnet 21 is disposed coaxially so as to generate a magnetic field in the space between the work table 2 and the shower head 16. The dipole ring magnet 21 is rotatable by rotating means, such as a motor, which is not shown in the drawings.

The operation of the magnetron plasma etching apparatus having the above-described structure will now be described.

First, the gate valve 24 is opened and a semiconductor wafer 30 is loaded into the chamber 1. After the semiconductor wafer 30 is placed on the work table 2, the table 2 is moved up to a position indicated in the drawings. Meanwhile, the chamber 1 is exhausted via the exhaust port 19 by the vacuum pump of the exhaust mechanism 20.

When the interior of the chamber 1 is depressurized to the predetermined degree of vacuum, a process gas is introduced into the chamber 1 from the process gas supply mechanism 15. As the chamber 1 is exhausted and the process gas is introduced, the interior of the chamber 1 is maintained at a predetermined pressure, for example, 50 mTorr. In this state, an RF power having a frequency of, for example, 13.56 MHz, and a power of, for example, 1000 to 5000 W, is applied to the work table 2 from the RF power supply 10. At the same time, a predetermined voltage is applied to the electrode 6a of the electrostatic chuck 6 from the DC power supply 12, and thus the semiconductor wafer 30 is attracted and held by coulomb's force.

With an RF power applied to the work table 2 serving as the lower electrode, as described above, an RF electric field is generated, between the shower head 16 and the work table 2 serving as the upper and lower electrodes, in the direction connecting the electrodes 2 and 16 to each other. Meanwhile, a horizontal magnetic field is generated in the direction perpendicular to the electric field in the upper portion 1a of the chamber 1 by means of the dipole ring magnet 21. The process gas is turned into plasma by means of electric discharge caused by the RF electric field in the process space where the wafer 30 is placed. Then, a predetermined film arranged on the semiconductor wafer 30 is etched by the plasma thus generated. During this etching step, electrons are influenced by a force acting in the direction perpendicular to those of the electric field and magnetic field, and thus they drift along this direction.

Next, the dipole ring magnet will now be described.

Figure 2:
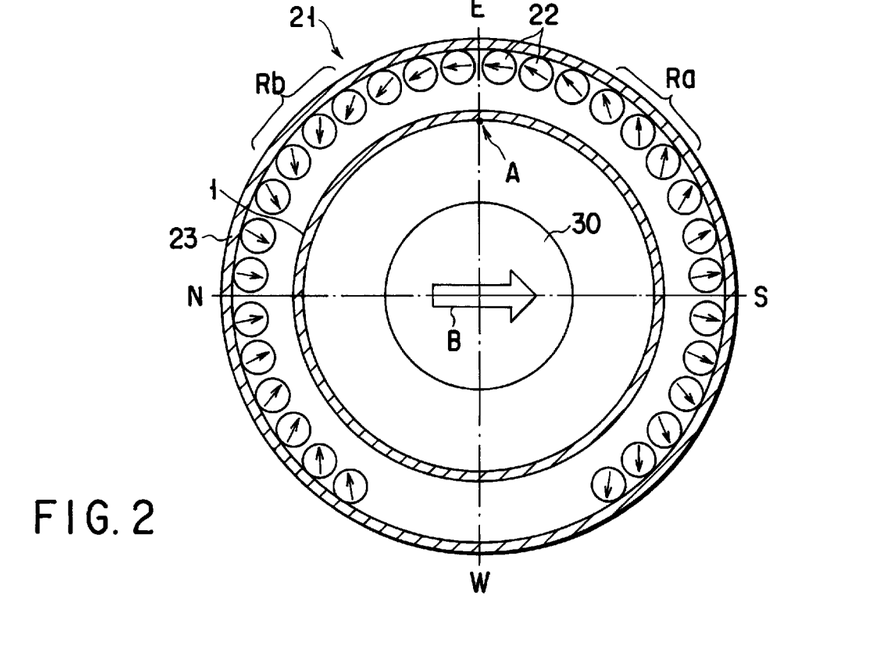
FIG. 2 is a schematic view showing the dipole ring magnet disposed around the chamber of the apparatus shown in FIG. 1.
Figure 3:
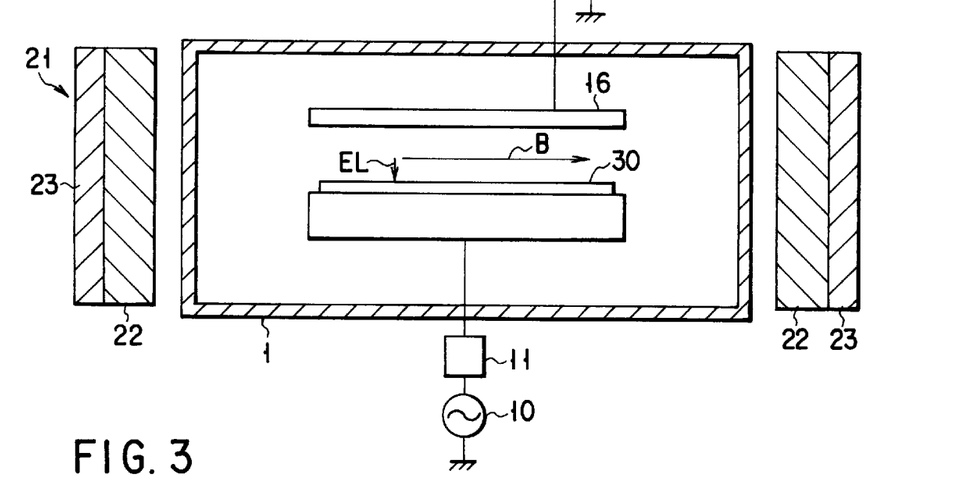
FIG. 3 is a schematic view showing the dipole ring magnet in the magnetron plasma etching apparatus shown in FIG. 1 and the state of the inside of the chamber.

FIG. 2 is a schematic view showing the dipole ring magnet disposed around the chamber 1, viewed from above, and FIG. 3 is a cross-sectional view schematically showing the dipole ring magnet and the inside of the process chamber.

As can be seen in these figures, the dipole ring magnet 21 has a structure in which a plurality of anisotropic columnar magnet segments 22 are mounted in a ring-shaped magnetic casing 23. In this example, thirty cylindrically shaped magnet segments 22 are arranged to have a ring-shaped format. The number and the cross-sectional shape of magnet segments are not limited to those shown in the drawings. Each magnet segment may have an arbitrary shape, for example, square, rectangular, trapezoid or the like. The magnetic material which constitute each magnet segment 22 is not particularly limited, but various magnetic materials, such as rare earth-based magnet, ferrite based magnet and alnico magnet, can be used.

In FIG. 2, the arrow indicated in each magnetic segment 22 shows the direction of magnetization of the respective segment. As can be seen from this figure, the directions of the magnetization of these magnet segments 22 are shifted slightly from each other, so as to form a horizontal magnetic field B directed in one direction as a whole. In FIG. 2, the proximal end side of the magnetic field is indicated by reference N, and the distal end side by reference S, and the positions displaced from these sides by an angle of 90 degrees are indicated by E and W, respectively.

As shown in FIG. 3, an electric field EL is formed above the semiconductor wafer 30, whereas the magnetic field B is formed in the chamber 1 in one direction from N towards S. Therefore, electrons generated travels from E towards W in a drift motion. Therefore, as it is, the electron density on the W side becomes high, thereby causing the non-uniformity of the plasma density. The plasma density increases with an increase in the magnetic field intensity. Therefore, by creating a gradient of the magnetic field intensity such that the magnetic field intensity is highest on the E side whereas it is low on the W side, the above-described problem can be solved.

Conventionally, some of magnet segments on the W side are removed, and the intensity of magnet segments on the E side is increased, so that the magnet is designed to have lines of magnetic force formed such that the magnetic field intensity is highest at the portion A (FIG. 2) on the E side end of the process space and drifting electrons are caused to diffuse on the W side. with this design, a uniform plasma density distribution can be actually obtained in the case of semiconductor wafers of 200 mm. However, when the diameter of the wafer is as large as 300 mm, and the magnetic field intensity at the E side end of the wafer is set as in the conventional technique, the density of drifting electrons may decrease at the W side end of the wafer. When the magnetic field intensity at the portion A is increased in order to avoid this, the uniformity of plasma is disturbed at the portion due to a regional increase in the magnetic field, and therefore a charge-up damage or the like may occur.

Figure 4:
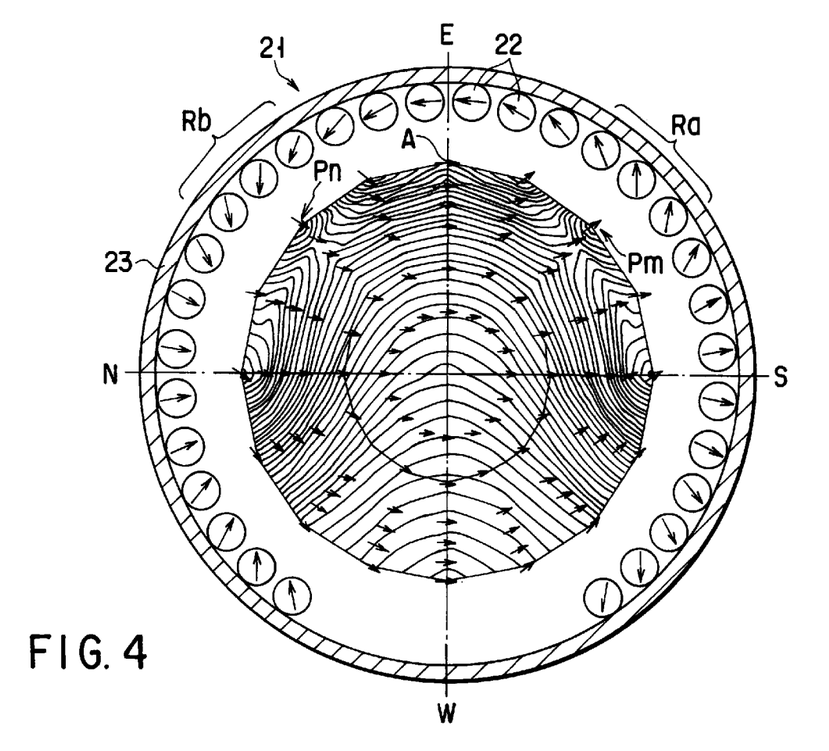
FIG. 4 is a diagram showing the distribution of the magnetic field intensity created by the dipole ring magnet shown in FIG. 2.

In order to solve the problem described above, the dipole ring magnet 21 of this embodiment takes the following structure. Specifically, the number of magnet segments on the W side are reduced so as to decrease the magnetic field intensity on the W side as shown in FIG. 2. Further, the intensity of magnet segments in the sections indicated by reference symbols Ra and Rb of FIG. 2 is increased, and thus such a magnetic field intensity distribution as shown in FIG. 4 is formed. More specifically, the structure is made such that the magnetic field intensity has maximum values or peaks at portions Pm and Pn which are located at positions declined by 45° with respect to the center of the wafer on both sides of the portion A on the E side end of the chamber 1. With this arrangement, the magnetic field intensity becomes uniform over a large area along the E side end of the semiconductor wafer 30 and a region right outside it, which corresponds to an area from Pm to Pn. The magnet is designed such that, for example, the magnetic field intensity is 200 gausses at the E side end of the wafer, 120 gausses at the center of the wafer, and 80 gausses at the W side end of the wafer 30.

Further, inn this case, there is a focus ring 5 made of a conductive material around the semiconductor wafer 30, and thus the electric field is also generated on the focus ring 5. Because the large area along the E side end of the semiconductor wafer 30 and a region right outside it, where the magnetic field intensity is highest, has a uniform intensity of the magnetic field, secondary electrons drift from a large area above the focus ring 5 adjacent to and outside the E side end of the semiconductor wafer 30 and diffuse towards the W side in a wide range. Therefore, even for a 300-mm wafer, the density of drifting electrons does not decrease even at the W side end of the wafer, and thus it becomes possible to produce uniform plasma.

Further, since the large area has the highest intensity of the magnetic field, the density of drifting electrons is prevented from decreasing without increasing the magnetic field intensity so much. By contrast, conventionally, only one point has highest intensity of the magnetic field, and thus the magnetic field intensity have to be increased to prevent the density of drifting electrons from lowering. As a result, a charge-up damage is easily caused at the E side end of the wafer 30.

(Second embodiment)

Figure 5:
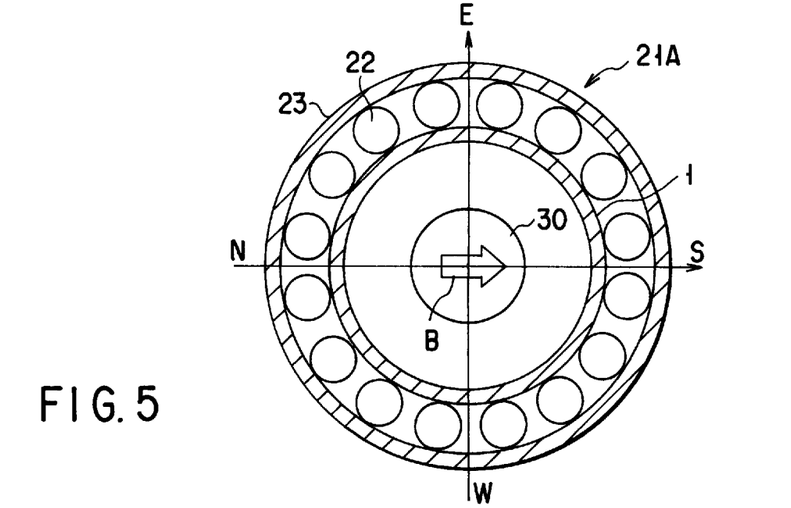
FIG. 5 is a horizontal cross-sectional view showing the dipole ring magnet used in the plasma etching apparatus according to the second embodiment of the present invention.

The magnetron plasma etching apparatus according to this embodiment has a structure similar to that of the first embodiment except that a dipole ring magnet 21A is provided in place of the dipole ring magnet 21.

As can be seen in FIG. 5, the dipole ring magnet 21A has a structure basically similar to that of the dipole ring magnet 21. More specifically, in the dipole ring magnet 21A, a plurality of anisotropic magnet segments 22 are coaxially arranged while being mounted in a ring-like magnetic casing 23. In this embodiment, the number and the cross-sectional shape of magnet segments are not limited to those shown in the drawings. The magnetic material which constitutes the segment 22 is not particularly limited, but various magnet materials, such as rare earth-based magnet, ferrite based magnet and alnico magnet, can be used.

In the dipole ring magnet 21A, the directions of the magnetization of these magnet segments 22 are shifted slightly from each other, so as to form a horizontal magnetic field B directed in one direction as a whole, as shown in FIG. 5, basically in the same manner as that of the conventional case. In FIG. 5, the proximal end side of the magnetic field is indicated by reference N, and the distal end side by reference S, and the positions displaced from these sides by an angle of 90 degrees are indicated by E and W, respectively.

As to the magnetron plasma etching apparatus of this embodiment, in the process space, an electric field EL is formed between plasma and the upper surface of the semiconductor wafer 30 as shown in FIG. 3, whereas the magnetic field B is formed in the chamber 1 in one direction substantially from N towards S. Therefore, drift of electrons occurs, and as it is, the electron density on the W side becomes high, thereby causing the non-uniformity of the plasma density.

Figure 6:
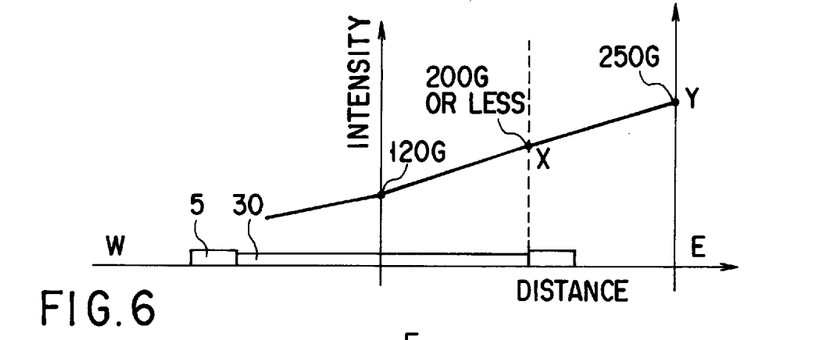
FIG. 6 is a schematic view showing the gradient of the magnetic field intensity in a cross section taken along E to W of the process space of the conventional magnetron plasma etching apparatus.

In consideration of the fact that the plasma density increases with an increase in the magnetic field intensity, conventionally, a dipole ring magnet is designed such that some of magnet segments on the W side are removed, and the intensity of magnet segments on the E side is increased. With this arrangement, lines of magnetic force are created such that the magnetic field intensity is highest at the portion of the process space corresponding to the E side end, and the drifting electrons are caused to diffuse on the W side. In this case, the magnetic field intensity in the E-W cross section in the process space has a linear gradient, such as shown in FIG. 6.

In order to etch the insulating film (oxide film, nitride film and the like) on the semiconductor wafer 30, it is necessary to control the magnetic field intensity to 200 G (gauss) or less even at the maximum intensity section on the semiconductor wafer 30. As shown in FIG. 6, in the case where the magnetic field intensity on the wafer is 200 G at the E side end where the intensity is maximum (point X), the intensity at the E side end in the chamber 1 (point Y) is about 250 G.

As the sizes of devices are reduced recently, it is required that the plasma etching process should be carried out at lower pressure. In order to perform an efficient plasma process at low pressure, it is required that the plasma density should be further increased. However, in the magnetic field intensity shown in FIG. 6, the amount of plasma generated is less, and the etching rate may become insufficient.

Figure 7:
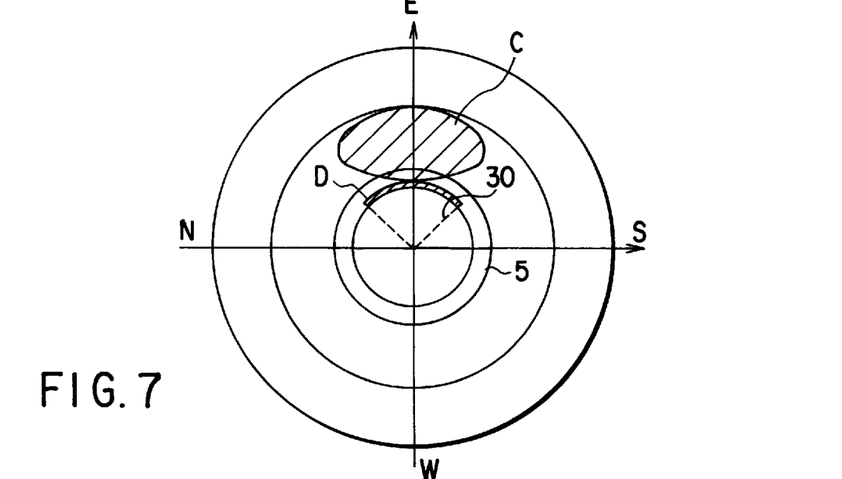
FIG. 7 is a schematic view showing the state of the magnetic field of the magnetic plasma etching apparatus according to the second embodiment of the present invention.
Figure 8:
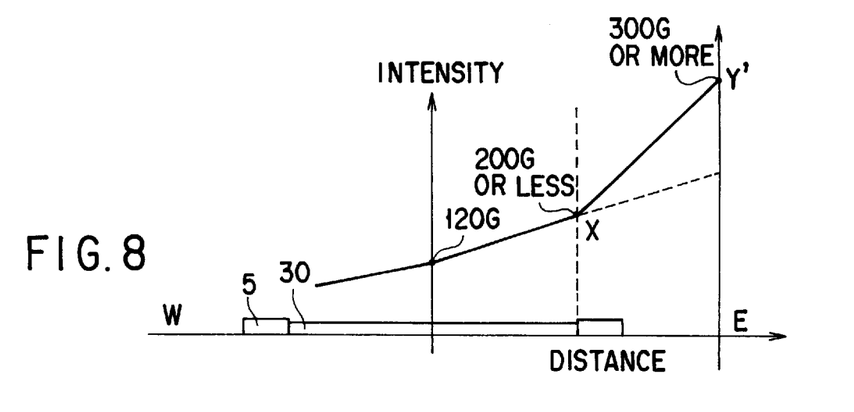
FIG. 8 is a schematic view showing the gradient of the magnetic field intensity in a cross section taken along E to W of the process space of the magnetron plasma etching apparatus according to the second embodiment of the present invention.

By contrast, in this embodiment, the dipole ring magnet 21A is designed such that the magnetic field intensity of the region C which is located outside the E side of the semiconductor wafer 30 becomes higher as shown in FIG. 7. In this case, the gradient of the magnetic field intensity in the region located outside the E side of the semiconductor wafer 30 becomes steeper than the gradient of the magnetic field on the surface of the semiconductor wafer 30, as shown in FIG. 8. In other words, if such a gradient of the magnetic field intensity as shown in FIG. 8 is formed, it is possible to increase the magnetic field intensity of the region which is located outside the E side of the semiconductor wafer 30.

Figure 9:
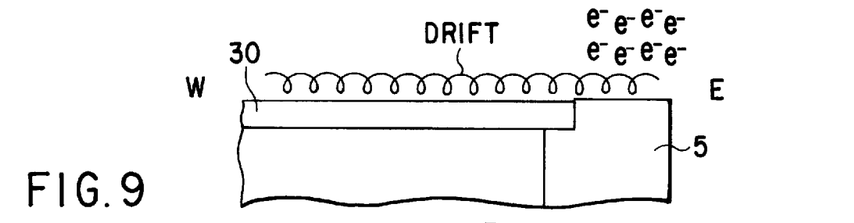
FIG. 9 is a schematic view showing the drift motion of electrons generated in the focus ring in the magnetron plasma etching apparatus according to the second embodiment of the present invention.

In this case, the focus ring 5 is made of a conductive material, and thus the electric field is also generated on the focus ring 5 to produce plasma. As shown in FIG. 9, electrons supplied from the plasma drift from the E side to the W side on the focus ring while making a cyclotron motion on the plasma sheath. The electrons drift further on the semiconductor wafer 30. As described above, the gradient of the magnetic field intensity outside the E side of the semiconductor wafer 30 is made steeper so as to increase the magnetic field intensify of this outside region, and therefore the Lamor radii of electrons become smaller. Consequently, the cyclotron motion of electrons becomes active, and the number of electrons drifting on the wafer 30 is increased, thereby increasing the plasma density. In this case, in order to obtain a relatively high plasma density of about $10^{10}$ ion/cm$^3$ or higher, the intensity should be set to 300 G or higher at the E side end in the chamber 1.

As show in FIG. 7, as in the first embodiment, it is preferable to form a large area C having a high magnetic field intensity outside the E side end of the semiconductor wafer 30, and a large area D having a uniform magnetic field intensity over the E side end and a region right outside it. With this arrangement, as in the first embodiment, electrons start drifting all at once within a large area in the vicinity of the end portion of the semiconductor wafer 30, and therefore the plasma density can be easily increased.

The profile of the magnetic field described above can be formed by adjusting the direction of the magnetic pole and the magnetic field intensity of each and individual magnet segment 22 of the dipole ring magnet 21A. For example, the intensity of one or more magnet segments 22 located on the E side may be increased. Further, where a magnetic field is formed to have a plurality of peak points of the intensity near the E side end in the chamber 1, which is the area of the end portion on the upstream side of the electron-drift direction, a uniform intensity of the magnetic field can be achieved over the large area D located along the E side end and a region right outside it, shown in FIG. 7. For example, as in the first embodiment shown in FIG. 4, the structure is made so that the magnetic field intensity has peak values at portions Pm and Pn which are located at positions declined by 45° with respect to the center of the wafer, and on both sides of the portion A on the E side end of the chamber 1. With this arrangement, the magnetic field intensity becomes uniform over a large area along the E side end of the semiconductor wafer 30 and a region right outside it, which corresponds to an area from Pm to Pn.

(Third embodiment)

Figure 10:
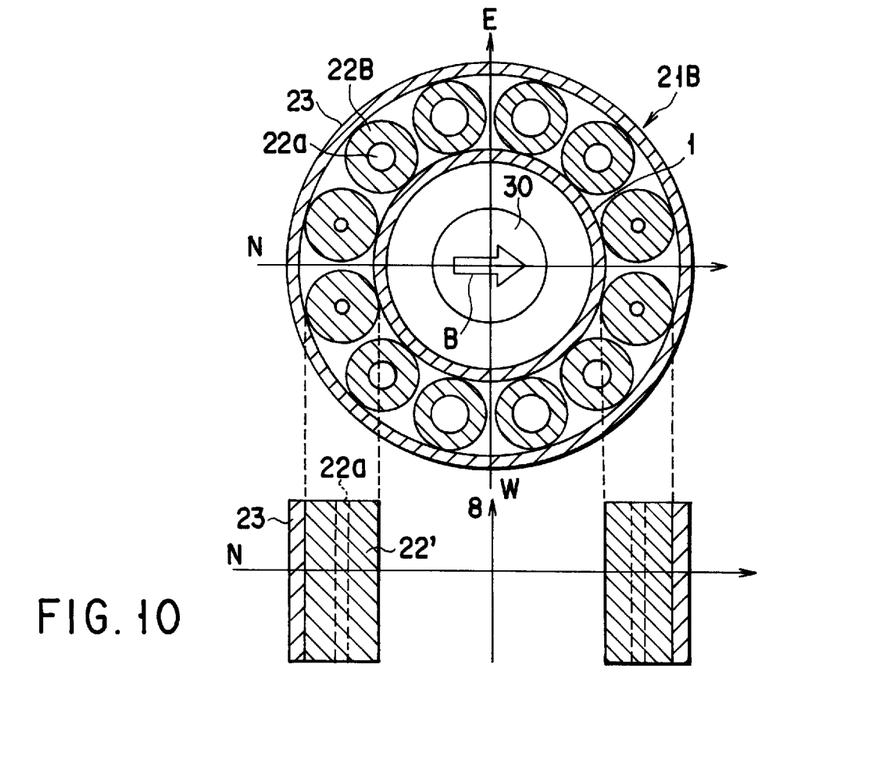
FIG. 10 is a horizontal cross-sectional view showing the dipole ring magnet used in the plasma etching apparatus according to the third embodiment of the present invention.

The magnetron plasma etching apparatus according to this embodiment has a structure similar to that of the first embodiment except that a dipole ring magnet 21B is provided in place of the dipole ring magnet 21.

As can be seen in FIG. 10, the dipole ring magnet 21B has a structure in which a plurality of anisotropic magnet segments 22B are coaxially arranged while being mounted in a ring-like magnetic casing 23. In this example, twelve magnet segments 22, each having a cylindrical shape with a columnar cavity 22a formed inside along its longitudinal direction, are arranged in ring-like manner (concentrical). However, in this embodiment, the number and the cross-sectional shape of magnet segments 22B are not limited to those shown in the drawings. Each magnet segment may have an arbitrary shape, for example, square, rectangular, trapezoid or the like. The magnetic material which constitute each magnet segment 22B is not particularly limited, but various magnetic materials such as, rare earth-based magnet, ferrite based magnet and alnico magnet, can be used.

In the dipole ring magnet 21B, the directions of the magnetization of these magnet segments 22B are shifted slightly from each other, so as to form a horizontal magnetic field B directed in one direction as a whole, as shown in FIG. 10, basically in the same manner as that of the conventional case. In FIG. 10, the proximal end side of the magnetic field is indicated by reference N, and the distal end side by reference S, and the positions displaced from these sides by an angle of 90 degrees are indicated by E and W, respectively, as in the case shown in FIG. 2.

All of the magnet segments 22B have the same height and outer diameters. When the size (that is, diameter) of the cavity 22a in each segment is adjusted, the capacity of magnetization changes. As shown in FIG. 10, in each magnet segment 22B, the size of the cavity 22a is adjusted in accordance with the position of the segment so that a predetermined magnetic field distribution or profile is formed by maintaining a horizontal magnetic field B as a whole in the process space where the semiconductor wafer 30 is present. That is, by adjusting the size of the cavity 22a of the magnetic segment 22B, the magnetic field can be corrected.

In the case where the magnetic field is corrected by forming the cavity 22a in each magnetic segment 22B, the correction can be made without creating the disturbance of the z component of the magnetic field, which may occur when the conventional magnetic segments, each having a space at the center to separate the upper and lower portion from each other, are used.

Figure 11:
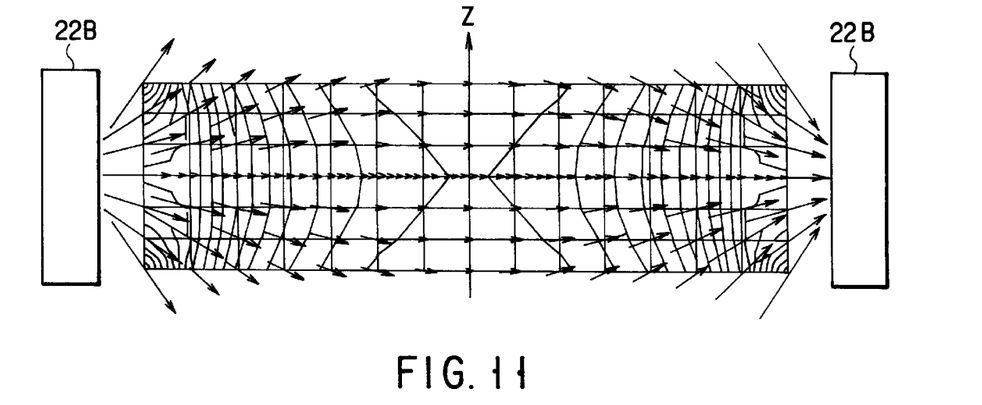
FIG. 11 is a view showing lines of magnetic force of the magnetic field formed by the dipole ring magnet shown in FIG. 10, in a process space.
Figure 12:
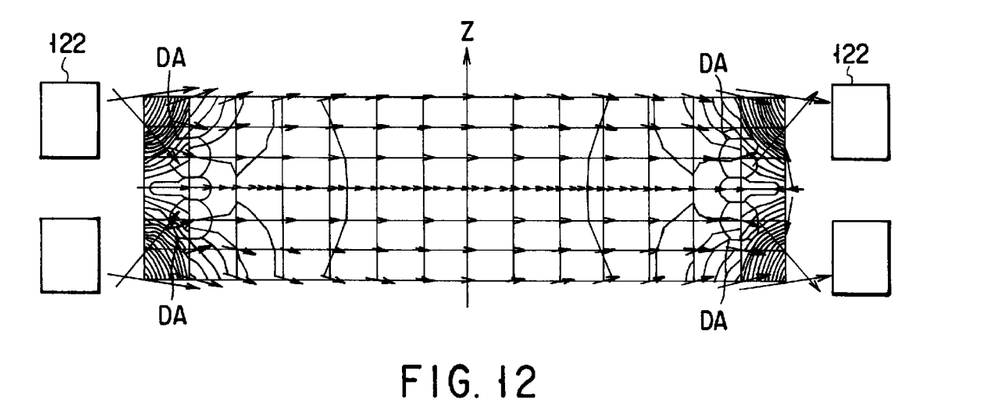
FIG. 12 is a view showing lines of magnetic force within the processing field of the magnetic field formed by the conventional dipole ring magnet in which anisotropic columnar magnetic segments each having a slit are used.

The above-described operation will now be described with reference to FIGS. 11 and 12. FIG. 11 is a diagram illustrating lines of magnetic force in the process space in the case using magnet segments 22B each having such a cavity 22a. FIG. 12 is a diagram illustrating lines of magnetic force in the process space in the case using the conventional anisotropic columnar magnetic segments 122 each having a slit at the center to separate the upper and lower portions from each other (each segment consisting of a pair of upper and lower portions). In these figures, Z-direction indicates the height direction (which is the direction perpendicular to the substrate). Further, the height of the magnet segments is 150 mm. In these figures, one scale in the height direction is 20 mm.

As shown in FIG. 12, when the conventional magnet segments each having a slit at its center, the z component of the magnetic field is disturbed near the sit as indicated by reference symbol DA. Therefore, the electron-drift direction reverses in this section and may cause an adverse effect onto the plasma process. By contrast, in the case using the magnet segments 22B each having a cavity 22a formed therein as described above, the disturbance of the z component of the magnetic field does not occur as shown in FIG. 11.

Figure 13A:
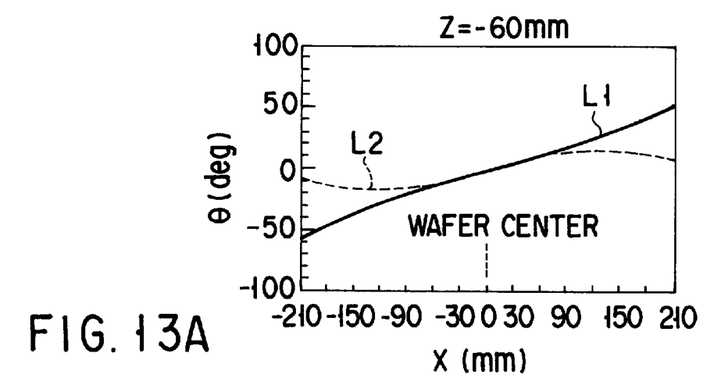
FIGS. 13A to 13C are diagrams showing inclinations of the directions of the magnetic fields in the case of FIGS. 11 and 12, against height positions.
Figure 13B:
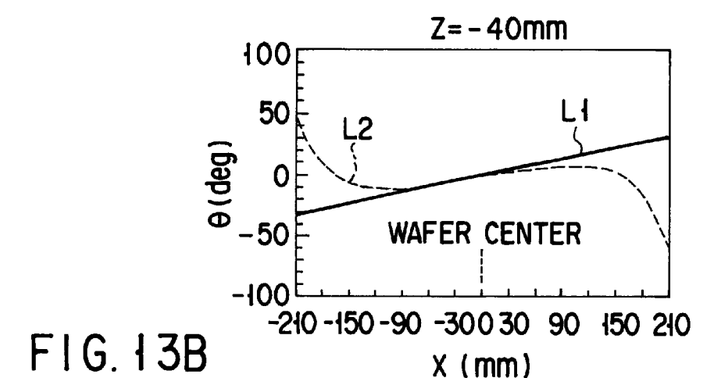
Figure 13C:
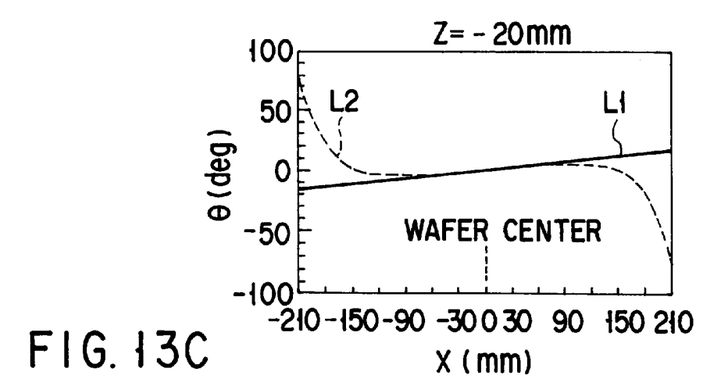

The above-described tendency can be more clearly understood from FIGS. 13A to 13C. FIGS. 13A to 13C are diagrams illustrating the inclination θ of the direction of the magnetic field in each of the cases shown in FIGS. 11 and 12, for various height positions Z (Z is a height measured from the center of the magnetic field), which are −60 mm, −40 mm and −20 mm, respectively. In FIGS. 13A to 13C, a solid line L1 indicates the case of the present invention, and a broken line L2 indicates the case where there is a lateral slit. As shown in these figures, in the case using the slit, there is a tendency that the absolute value of the inclination θ of the z direction of the magnetic field becomes large as the a positions becomes closer to the magnet center (z=0). By contrast, in the case of the present invention, such a tendency cannot be found. Thus, by means of magnet segments 22B each provided with a cavity 22a, it becomes possible to carry out excellent plasma process without causing the disturbance of the z component of the magnetic field.

In the case of this embodiment, within the process space, the magnetic field B is generated to be directed in one direction approximately from N towards S in the chamber 1, and therefore electrons generated in the process space travel from the E towards W by a drifting motion. Therefore, as it is, the electron density on the W side becomes high, causing the non-uniformity of the plasma density.

Figure 14:
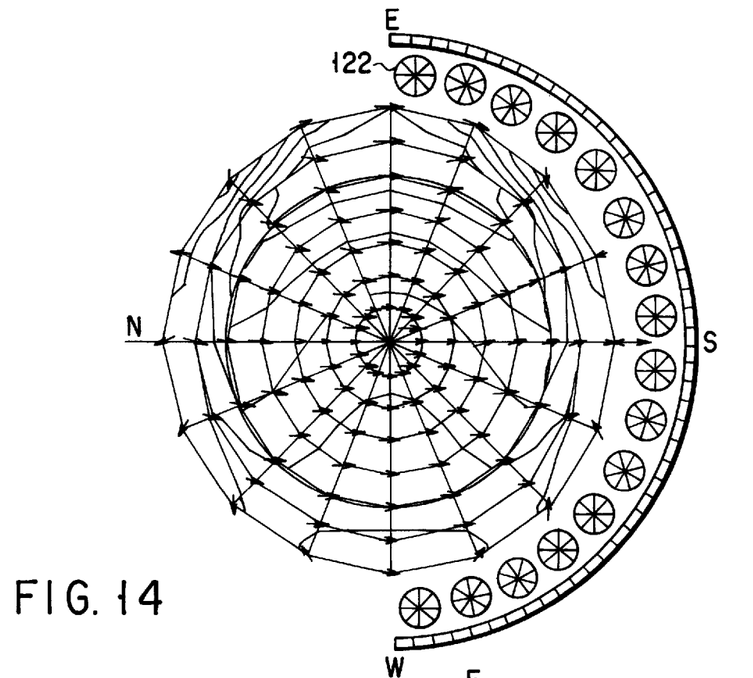
FIG. 14 is a diagram illustrating a magnetic field formed by a dipole ring magnet according to the present invention in which anisotropic columnar magnetic segments each having a slit are used, wherein the field has a gradient in which the magnetic field intensity is higher in the E side whereas it is lower in the W side.

In consideration of the fact that the plasma density increases with an increase in the magnetic field intensity, conventionally, a dipole ring magnet is designed such that a slit is made at the center of each magnet segment, and the gap size of the slit is adjusted for each individual magnet segment. With this arrangement, a gradient of the magnetic field is created such that the intensity of the field is high on the E side whereas it is low on the W side. Even if such conventional magnet segments are used, a magnetic field intensity distribution according to the present invention can be formed, as shown in FIG. 14. This figure shows the case using thirty anisotropic columnar magnet segments 122. It should be noted that only those segments 122 which are located on the right half section are shown.

Figure 15:
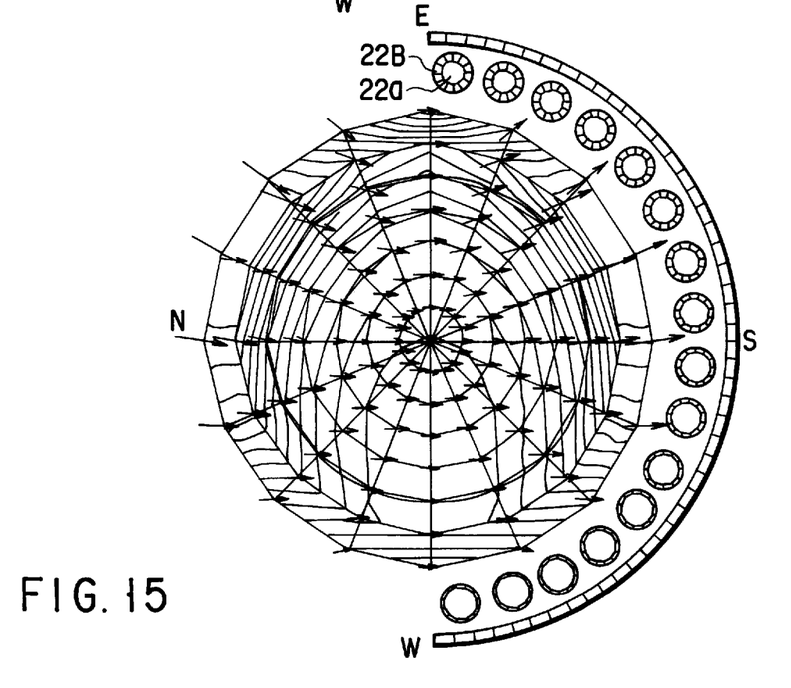
FIG. 15 is a plan view of a magnetic field formed by the dipole ring magnet shown in FIG. 10, wherein the field has a gradient in which the magnetic field intensity is higher in the E side whereas it is lower in the W side.

By contrast, in this embodiment, by means of the magnet segments 22B each having the cavity 22a along its longitudinal direction, a gradient of the magnetic field intensity is created such that the magnetic field intensity is high on the E side and is low on the W side, as shown in FIG. 15. In this case, for each magnetic segment 22B, the size of the cavity 22 is adjusted in accordance with the position where the segment is located, so as to correct the magnetic field. More specifically, on the E side where the magnetic field is intensified, the cavity of a magnet segment 22B is made small, whereas on the W side where the magnetic field is week, the cavity of a magnet segment 22B is enlarged. It should be noted that FIG. 15 shows the case using thirty anisotropic columnar magnet segments 122, and only the right half section of the magnet 22 is shown.

As described above, according to this embodiment, a gradient of the magnetic field intensity can be created such that the magnetic field intensity is high on the E side and is low on the W side, without causing the disturbance of the z component of the magnetic field. Consequently, even more uniform plasma process can be carried out.

Further, the dipole ring magnet 21 of this embodiment, which includes the above-described magnet segments 22B, can be applied to the first and second embodiments described before, as well. In short, the magnetic field is adjusted with the magnet segments 22B such that a magnetic field profile, such as of the first or second embodiment is formed. Thus, the above-described effect of the invention can be achieved without causing the disturbance of the z component of the magnetic field.

In this embodiment, as to the horizontal magnetic field formed from N towards W, there is a slight inclination with respect to the horizontal direction of the magnetic field, at positions close to the magnet and distant from the center of the magnet (z=0). In order to suppress this, the height of the magnetic segment 22B is preferably increased. In this manner, the inclination of the direction of the magnetic field can be decreased.

Figure 16A:
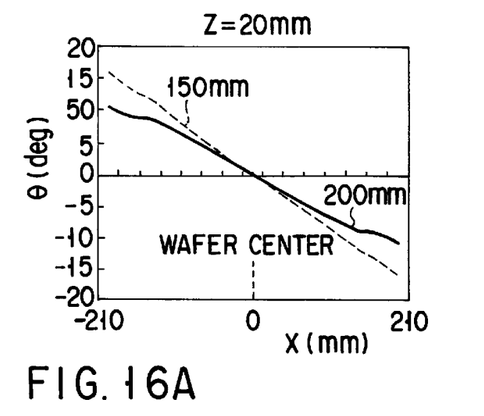
FIGS. 16A to 16C are diagrams showing inclinations of the directions of the magnetic fields, against various heights of the dipole ring magnet of the present invention, which consists of anisotropic magnet segments.
Figure 16B:
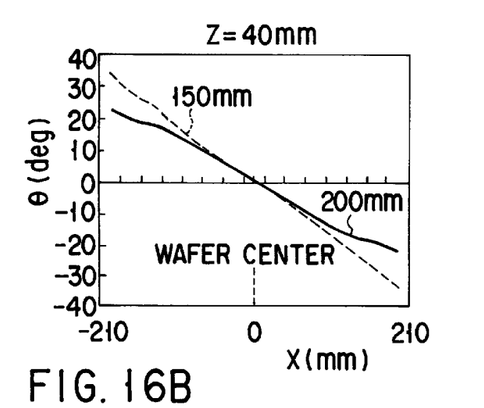
Figure 16C:
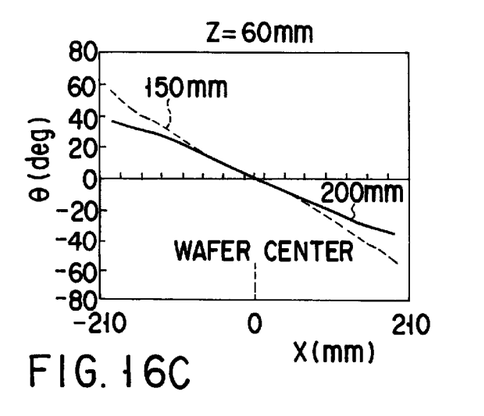

FIGS. 16A to 16C are diagrams illustrating the inclination θ of the direction of the magnetic field in each of the cases where the height of the dipole ring magnet is set to 150 mm and 200 mm, for various height positions Z (Z is a height measured from the center of the magnetic field), which are 20 mm, 40 mm and 60 mm, respectively. In FIGS. 16A to 16C, a solid line indicates the case where the height of the magnet is 200 mm, and a broken line indicates the case where the height of the magnet is 150 mm. As shown in these figures, there is a tendency that the inclination θ of the direction of the magnetic field increases as a position becomes more distant from the center of the magnetic field (that is, as the absolute value of z becomes larger).

In the case where the height of the magnet is 150 mm, the inclination θ at a position close to the magnet where z=60 mm tends to become larger, and it reaches as steep as θ=60°. By contrast, in the case where the height of the magnet is 200 mm, the inclination θ tends to become smaller as a whole, and it reaches only as steep as θ=40° or less at a position where z=60 mm. Thus, by increasing the height of the magnet, the horizontality of the magnetic field can be improved. Therefore, even more uniform plasma process can be achieved.

The present invention is not limited to the embodiments described above, but can be modified into various version. For example, in the first embodiment, the structure is made such that the magnetic field intensity has peak values at portions Pm and Pn which are located at positions declined by 45° with respect to the center of the wafer on both sides of the portion A on the E side end in the process space of the chamber 1. However, positions where peak values of the magnetic field intensity appear and the number of positions are not necessarily limited to those specified in the first embodiment. Further, in the first embodiment, if a uniform magnetic field area is formed at the E side end of the wafer and a position outside it, such that the density of the drifting electrons does not decrease at the W side end, it is not always necessary to form a magnetic field which has such peak points of the intensity.

Further, the second embodiment has a structure in which the magnetic field is intensified over a large area right outside the E side of the semiconductor wafer. However, it may have a different magnetic field intensity profile, for example, in which the intensity is high at a plurality of, for example, 2 positions regionally right outside the E side of the semiconductor wafer.

Further, in the first and second embodiments, the dipole ring magnet is used; however as long as a desired magnetic field can be obtained, it is not essential to use the dipole ring magnet as a magnetic field forming means.

Further, in the first and second embodiments, the present invention is applied to the magnetron plasma etching device; however the application of the invention is not limited to this, but it can be utilized in some other plasma process. More specifically, when the process gas is changed from the etching gas to a known CVD gas, a magnetron plasma CVD apparatus can be realized. Alternatively, when a sputtering target is placed in the chamber to face a target substrate, a magnetron plasma sputtering apparatus can be realized. Further, as the target substrate, a semiconductor wafer is discussed; however the object to be processed is not limited to this, but may be some other substrate, such as a substrate for a liquid crystal display (LCD) device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetron plasma processing apparatus comprising:
    a chamber configured to accommodate a target substrate;
    a pair of electrodes arranged in said chamber to face each other, the target substrate being mounted on one of said electrodes to be position between said electrodes;
    an electric field generator configured to generate an electric field between said electrodes to have an electric field direction in a first direction connecting said electrodes to each other;
    an exhaust mechanism configured to exhaust and set said chamber to a vacuum;
    a process gas supply mechanism configured to supply a process gas into said chamber; and
    a magnetic field generator configured to generate a magnetic field between said electrodes to have a magnetic field direction in a second direction perpendicular to said first direction, electrons being caused to drift in a drift direction perpendicular to said first and second directions, in cooperation with said electric field and said magnetic field,
    wherein said magnetic field has, on a plane perpendicular to said first direction between said electrodes, a gradient of a magnetic field intensity such that the magnetic field intensity is higher on an upstream side and is lower on a downstream side in said drift direction, and has a uniform magnetic field intensity over a large area along an upstream end of the target substrate in said drift direction and a region outside said upstream end.

2. The apparatus according to claim 1, wherein said magnetic field has a gradient of a magnetic field intensity at a position outside said upstream end of the target substrate is steeper than a gradient of a magnetic field on a surface of the target substrate in said drift direction.

3. The apparatus according to claim 1, wherein said magnetic field generator comprises a dipole ring magnet formed such that a plurality of anisotropic magnet segments are arranged in a ring-like format around said chamber to form said magnetic field.

4. The apparatus according to claim 3, wherein said anisotropic magnet segments are provide with cavities, respectively, formed therein and extending in said first direction, and said cavities have sizes set in accordance with positions of said segments to cause said magnetic field to have a profile.

5. The apparatus according to claim 1, wherein:
    said large area of a uniform magnetic field intensity expands by at least 45° with respect to a center of the target substrate on either side of said upstream end in said chamber in said drift direction.

6. A magnetron plasma processing apparatus comprising:
    a chamber configured to accommodate a target substrate;
    a pair of electrodes arranged in said chamber to face each other, the target substrate being mounted on one of said electrodes to be position between said electrodes;
    an electric field generator configured to generate an electric field between said electrodes to have an electric field direction in a first direction connecting said electrodes to each other;
    an exhaust mechanism configured to exhaust and set said chamber to a vacuum;
    a process gas supply mechanism configured to supply a process gas into said chamber; and
    a magnetic field generator configured to generate a magnetic field between said electrodes to have a magnetic field direction in a second direction perpendicular to said first direction, electrons being caused to drift in a drift direction perpendicular to said first and second directions, in cooperation with said electric field and said magnetic field,
    wherein said magnetic field has, on a plane perpendicular to said first direction between said electrodes, has a gradient of a magnetic field intensity such that the magnetic field intensity is higher on an upstream side and is lower on a downstream side in said drift direction, and has a plurality of peaks of a magnetic field intensity in an upstream end area in said chamber in said drift direction.

7. The apparatus according to claim 6, wherein said magnetic field has a gradient of a magnetic field intensity at a position outside said upstream end of the target substrate that is steeper than a gradient of a magnetic field on a surface of the target substrate in said drift direction.

8. The apparatus according to claim 6, wherein said magnetic field has two peaks of a magnetic field intensity at positions which are located on both sides of an upstream end in said chamber in said drift direction and is declined by 45° with respect to a center of the target substrate.

9. The apparatus according to claim 6, wherein said magnetic field generator comprises a dipole ring magnet formed such that a plurality of anisotropic magnet segments are arranged in a ring-like format around said chamber to form said magnetic field.

10. The apparatus according to claim 9, wherein said anisotropic magnet segments are provide with cavities, respectively, formed therein and extending in said first direction, and said cavities have sizes set in accordance with positions of said segments to cause said magnetic field to have a profile.

11. A magnetron plasma processing apparatus comprising:
    a chamber configured to accommodate a target substrate;
    a pair of electrodes arranged in said chamber to face each other, the target substrate being mounted on one of said electrodes to be position between said electrodes;
    an electric field generator configured to generate an electric field between said electrodes to have an electric field direction in a first direction connecting said electrodes to each other;
    an exhaust mechanism configured to exhaust and set said chamber to a vacuum;

a process gas supply mechanism configured to supply a process gas into said chamber; and a magnetic field generator configured to generate a magnetic field between said electrodes to have a magnetic field direction in a second direction perpendicular to said first direction, electrons being caused to drift in a drift direction perpendicular to said first and second directions, in cooperation with said electric field and said magnetic field, wherein said magnetic field has, on a plane perpendicular to said first direction between said electrodes, a gradient of a magnetic field intensity such that the magnetic field intensity is higher on an upstream side and is lower on a downstream side, and has a gradient of a magnetic field intensity at a position outside said upstream end of the target substrate in said drift direction that is steeper than a gradient of a magnetic field on a surface of the target substrate in said drift direction.

12. The apparatus according to claim 11, wherein said magnetic field has to have a uniform magnetic field intensity over a large area along an upstream end of the target substrate in said drift direction and a region outside said upstream end.

13. The apparatus according to claim 10, wherein:

said large area of a uniform magnetic field intensity expands by at least 45° with respect to a center of the target substrate on either side of said upstream end in said chamber in said drift direction.

14. The apparatus according to claim 11, wherein said magnetic field has to have a plurality of peaks of a magnetic field intensity in an upstream end area in said chamber in said drift direction.

15. The apparatus according to claim 10, further comprising a conductive ring arranged to surround the target substrate.

16. The apparatus according to claim 11, wherein said magnetic field has to have a magnetic field intensity of 200 gausses or less at an upstream end of the target substrate in said drift direction.

17. The apparatus according to claim 16, wherein said magnetic field has to have a magnetic field intensity of 300 gausses or more at an upstream end in said chamber in said drift direction.

18. The apparatus according to claim 17, wherein:

said magnetic field has a uniform magnetic field intensity over a large area along an upstream end of the target substrate in said drift direction and a region outside said upstream end.

19. The apparatus according to claim 18, wherein:

said large area of a uniform magnetic field intensity expands by at least 45° with respect to a center of the target substrate, on either side of said upstream end in said chamber in said drift direction.

20. The apparatus according to claim 11, wherein said magnetic field generator comprises a dipole ring magnet formed such that a plurality of anisotropic magnet segments are arranged in a ring-like format around said chamber to form said magnetic field.

21. The apparatus according to claim 20, wherein said anisotropic magnet segments are provide with cavities, respectively, formed therein and extending in said first direction, and said cavities have sizes set in accordance with positions of said segments to cause said magnetic field to have a profile.

22. A magnetron plasma processing apparatus comprising:

a chamber configured to accommodate a target substrate;

a pair of electrodes arranged in said chamber to face each other, the target substrate being mounted on one of said electrodes to be position between said electrodes;

an electric field generator configured to generate an electric field between said electrodes to have an electric field direction in a first direction connecting said electrodes to each other;

an exhaust mechanism configured to exhaust and set said chamber to a vacuum;

a process gas supply mechanism configured to supply a process gas into said chamber; and a magnetic field generator configured to generate a magnetic field between said electrodes to have a magnetic field direction in a second direction perpendicular to said first direction, electrons being caused to drift in a drift direction perpendicular to said first and second directions, in cooperation with said electric field and said magnetic field, wherein said magnetic field generator comprises a dipole ring magnet formed such that a plurality of anisotropic magnet segments are arranged in a ring-like format around said chamber to form said magnetic field, and wherein said anisotropic magnet segments are provide with cavities, respectively, formed therein and extending in said first direction, and said cavities have sizes set in accordance with positions of said segments to cause said magnetic field to have a profile.

23. The apparatus according to claim 22, wherein said magnetic field has, on a plane perpendicular to said first direction between said electrodes, a gradient of a magnetic field intensity such that the magnetic field intensity is higher on an upstream side and is lower on a downstream side in said drift direction.

* * * * *